United States Patent
Syn et al.

(10) Patent No.: US 9,082,920 B2
(45) Date of Patent: Jul. 14, 2015

(54) BACK CONTACT SOLAR CELL AND MANUFACTURING METHOD THEREOF

(75) Inventors: Hojung Syn, Seoul (KR); Hyunjin Yang, Seoul (KR); Junghoon Choi, Seoul (KR); Youngjoo Eo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 68 days.

(21) Appl. No.: 13/269,261

(22) Filed: Oct. 7, 2011

(65) Prior Publication Data

US 2012/0145233 A1 Jun. 14, 2012

(30) Foreign Application Priority Data

Oct. 11, 2010 (KR) .................. 10-2010-0098925

(51) Int. Cl.
  H01L 31/0232 (2014.01)
  H01L 31/0224 (2006.01)
  H01L 31/0216 (2014.01)
  H01L 31/0747 (2012.01)

(52) U.S. Cl.
  CPC ...... *H01L 31/0747* (2013.01); *H01L 31/02167* (2013.01); *H01L 31/02168* (2013.01); *H01L 31/022441* (2013.01); *Y02E 10/52* (2013.01)

(58) Field of Classification Search
  CPC ................ H01L 31/0747; H01L 31/022441
  USPC ....................................................... 136/256
  See application file for complete search history.

(56) References Cited

U.S. PATENT DOCUMENTS

| 2002/0002992 A1* | 1/2002 | Kariya et al. .................. 136/255 |
| 2006/0130891 A1* | 6/2006 | Carlson .......................... 136/256 |
| 2007/0169808 A1 | 7/2007 | Kherani et al. |
| 2008/0173347 A1* | 7/2008 | Korevaar et al. ............... 136/255 |
| 2009/0151784 A1* | 6/2009 | Luan et al. ..................... 136/256 |
| 2009/0301557 A1* | 12/2009 | Agostinelli et al. ........... 136/256 |
| 2010/0218821 A1* | 9/2010 | Kim et al. ....................... 136/256 |

(Continued)

FOREIGN PATENT DOCUMENTS

JP 2009-524916 A 7/2009
KR 10-2009-0101395 A 9/2009

(Continued)

OTHER PUBLICATIONS

Kiebach, Characterization of Silicon Rich Oxides with Tunable Optical Band Gap on Sapphire Substrates by Photoluminescence, UV/Vis and Raman Spectroscopy, 2008, Journal of the Mexican Chemistry Society, 52, pp. 212-218.*

*Primary Examiner* — Jonathan Johnson
*Assistant Examiner* — Bethany L Martin
(74) *Attorney, Agent, or Firm* — Birch, Stewart, Kolasch & Birch, LLP

(57) ABSTRACT

A back contact solar cell and a method for manufacturing the back contact solar cell are discussed. The back contact solar cell includes a substrate made of crystalline silicon having a first conductivity type, a passivation layer on one side of the substrate, an antireflection layer on the passivation layer, a first electrode on the other side of the substrate, a second electrode on the other side of the substrate and separated from the first electrode, a first semiconductor layer disposed between the first electrode and the substrate and having the first conductivity type, and a second semiconductor layer disposed between the second electrode and the substrate and having a second conductivity type that is opposite to the first conductivity type. The passivation layer includes at least one of amorphous silicon oxide and amorphous silicon carbide.

10 Claims, 5 Drawing Sheets

(56) References Cited

U.S. PATENT DOCUMENTS

2010/0258177 A1* 10/2010 Ko et al. ................. 136/256
2012/0129295 A1   5/2012  Oh et al.

FOREIGN PATENT DOCUMENTS

KR   10-2010-0075045 A   7/2010
WO   WO 2009/079199 A1   6/2009

* cited by examiner

BACK CONTACT SOLAR CELL AND MANUFACTURING METHOD THEREOF

This application claims priority to and the benefit of Korea Patent Application No. 10-2010-0098925, filed on Oct. 11, 2010 in the Korean Intellectual Property Office, the disclosure of which is incorporated herein by reference.

BACKGROUND OF THE INVENTION

1. Field of the Invention

Embodiments of the invention relate to a back contact solar cell and a method for manufacturing the same and, more particularly, to a back contact solar cell including a passivation layer having large bandgap energy at a light receiving surface and a method for manufacturing the same.

2. Description of the Related Art

Lately, alternative energy sources have been receiving greater attention because it has been expected that traditional energy resources such as oil and coal will be depleted eventually. As the up and coming alternative energy source, a solar cell has drawing attention. The solar cell is also referred to as a next generation battery that employs a semiconductor element capable of directly converting solar light energy into electric energy.

That is, the solar cell is a device that converts light energy into electric energy using the photovoltaic effect. Such a solar cell may be classified into a silicon solar cell, a thin film solar cell, a dye-sensitized solar cell (DSSC), and an organic polymer solar cell. In order to improve the performance of the solar cell, it is important to increase the light-to-electric conversion efficiency of the solar cell.

A back contact solar cell includes electrodes formed at a rear side thereof. Since all electrodes are arranged at the rear side, the back contact solar cell can prevent loss of incident solar light, which may be caused in a solar cell having electrodes arranged at a front side thereof. Therefore, the back contact solar cell increases quantity of absorbed incident light. However, it is still important to increase the light-to-electric conversion efficiency even for the back contact solar cell in order to further improve the performance thereof.

SUMMARY OF THE INVENTION

Accordingly, an aspect of the invention is to solve at least the problems and disadvantages of the related art.

In accordance with an aspect of the invention, a back contact solar cell includes a substrate made of crystalline silicon having a first conductivity type, a passivation layer on one side of the substrate, an antireflection layer on the passivation layer, a first electrode on the other side of the substrate, a second electrode on the other side of the substrate and separated from the first electrode, a first semiconductor layer disposed between the first electrode and the substrate and having the first conductivity type, and a second semiconductor layer disposed between the second electrode and the substrate and having a second conductivity type that is opposite to the first conductivity type. The passivation layer may include at least one of amorphous silicon oxide and amorphous silicon carbide.

The passivation layer may include a first layer on one side of the substrate, wherein the first layer includes amorphous silicon, and a second layer on the first layer, wherein the second layer includes at least one of amorphous silicon oxide and amorphous silicon carbide.

The passivation layer may have a bandgap energy of between about 1.8 eV and about 2.25 eV.

The first semiconductor layer may be an amorphous silicon layer having an impurity concentration that is higher than that of the substrate.

The back contact solar cell may further include an intrinsic amorphous semiconductor layer disposed between the substrate and the first semiconductor layer.

The second semiconductor layer may be an intrinsic amorphous silicon layer for forming a hetero junction at an interface between the second semiconductor layer and the substrate.

The back contact solar cell may further include an intrinsic amorphous semiconductor layer disposed between the substrate and the second semiconductor layer.

The antireflection layer may be a transparent electrode.

Each one of the first and second electrodes may include a transparent electrode layer, and a metal layer on the transparent layer.

An uneven surface may be formed on one side of the substrate.

The back contact solar cell may further include a rear passivation layer on the other side of the substrate. The first electrode may contact the first semiconductor layer through the rear passivation layer, and the second electrode may contact the second semiconductor layer through the rear passivation layer.

The rear passivation layer may be made of a material identical to that of the passivation layer.

In accordance with another aspect of the invention, a back contact solar cell includes a substrate made of crystalline silicon having a first conductivity type, a passivation layer on one side of the substrate, an antireflection layer on the passivation layer, a first electrode on the other side of the substrate, a second electrode on the other side of the substrate and separated from the first electrode, a first semiconductor layer disposed between the first electrode and the substrate and having the first conductivity type, and a second semiconductor layer disposed between the second electrode and the substrate and having a second conductivity type that is opposite to the first conductivity type. The first and second semiconductor layers may be an amorphous silicon layer. The passivation layer may have a bandgap energy of between about 1.8 eV and about 2.25 eV.

The passivation layer may include at least one of amorphous silicon oxide and amorphous silicon carbide.

The passivation layer may include a first layer formed on one side of the substrate, wherein the first layer includes amorphous silicon, and a second layer formed on the first layer, wherein the second layer includes one of amorphous silicon oxide and amorphous silicon carbide.

In accordance with still another aspect of the invention, in order to manufacture a back contact solar cell, a passivation layer is formed on one side of a substrate made of crystalline silicon and having a first conductivity type. An antireflection layer is formed on the passivation layer. Then, a first semiconductor layer having a first conductivity type and a second semiconductor layer having a second conductivity type are formed on the other side of the substrate at an interval. After forming the first and second semiconductor layers, first and second electrodes are formed on the first and second semiconductor layers, respectively. The first and second semiconductor layers may be made of amorphous silicon, and the passivation layer is made of at least one of amorphous silicon oxide and amorphous silicon carbide.

In the forming of the passivation layer, a first layer made of amorphous silicon may be formed. Then, a second layer made of at least one of amorphous silicon oxide and amorphous silicon carbide may be formed on the first layer.

In the forming of the first second electrodes, a transparent electrode layer and a metal layer may be formed sequentially.

The passivation layer may have a bandgap energy of between about 1.8 eV and about 2.25 eV.

BRIEF DESCRIPTION OF THE DRAWINGS

Embodiments of the invention will be described in detail with reference to the following drawings in which like numerals refer to like elements.

DETAILED DESCRIPTION OF THE EMBODIMENTS

Figure 1:
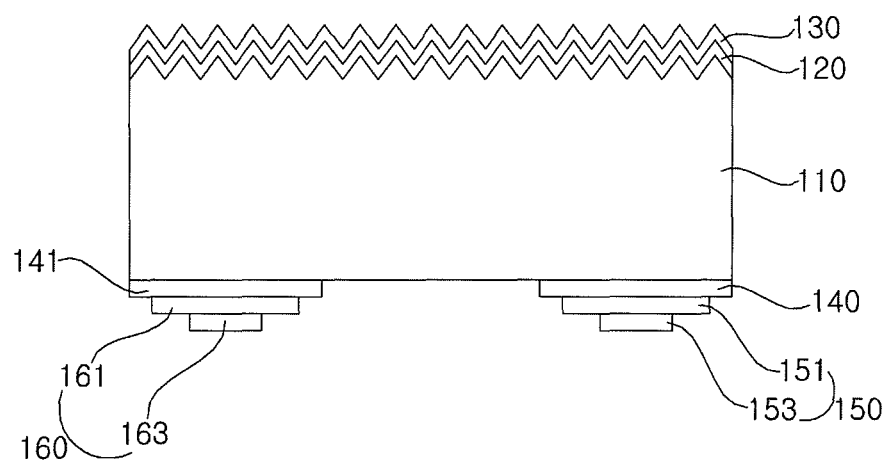
FIG. 1 is a cross-sectional view that illustrates a cross-section of a back contact solar cell in accordance with an embodiment of the invention.

In the drawings, it will be understood that when each constituent element such as a layer, film, region, or substrate is referred to as being "on" or "under" another element, it can be directly on or under the other element or it can be indirectly on or under the other element. Intervening elements may also be present. Furthermore, a top or a bottom of each constituent element may be described based on a top or a bottom of the drawings. In the drawings, each constituent element may be exaggerated, omitted, or schematically illustrated for better understanding and ease of description. A size of each constituent element may be different from the actual size thereof.

It is an object of the invention to provide a back contact solar cell for improving light absorption, and a method for manufacturing the same.

Hereinafter, a back contact solar cell in accordance with an embodiment of the invention will be described with reference to accompanying drawings.

Figure 2:
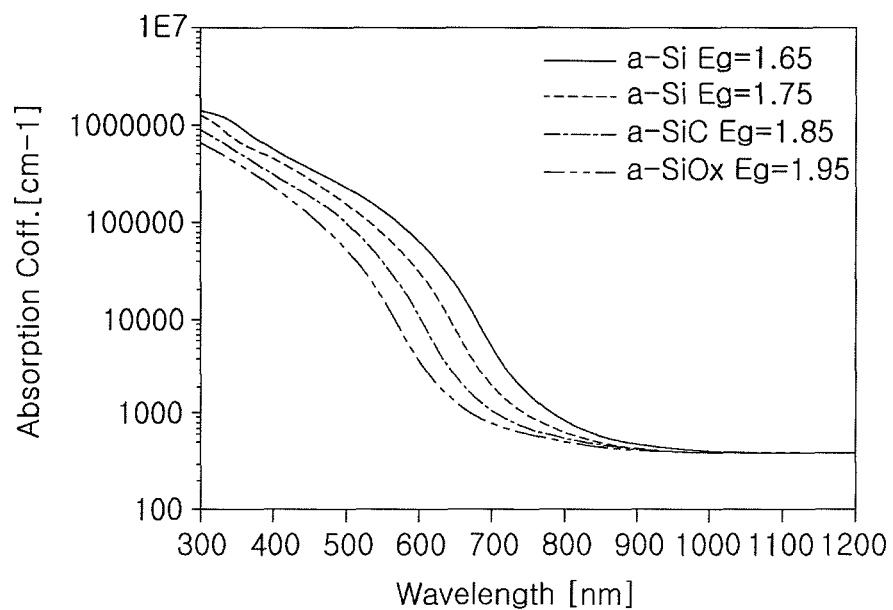
FIG. 2 is a diagram that illustrates change of light absorption coefficients according to band-gap energy.
Figure 3:
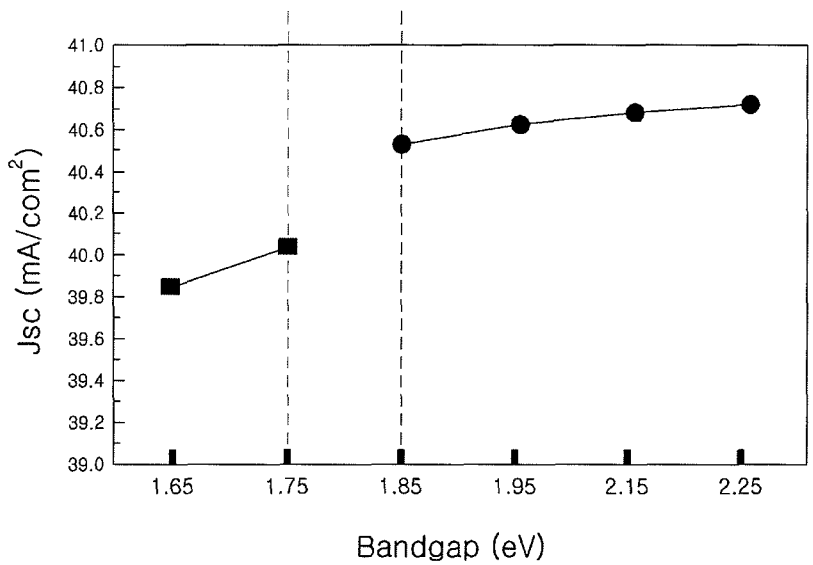
FIG. 3 illustrates $J_{SC}$ of a back contact solar cell of FIG. 1, which changes according to a bandgap energy of a passivation layer.
Figure 4:
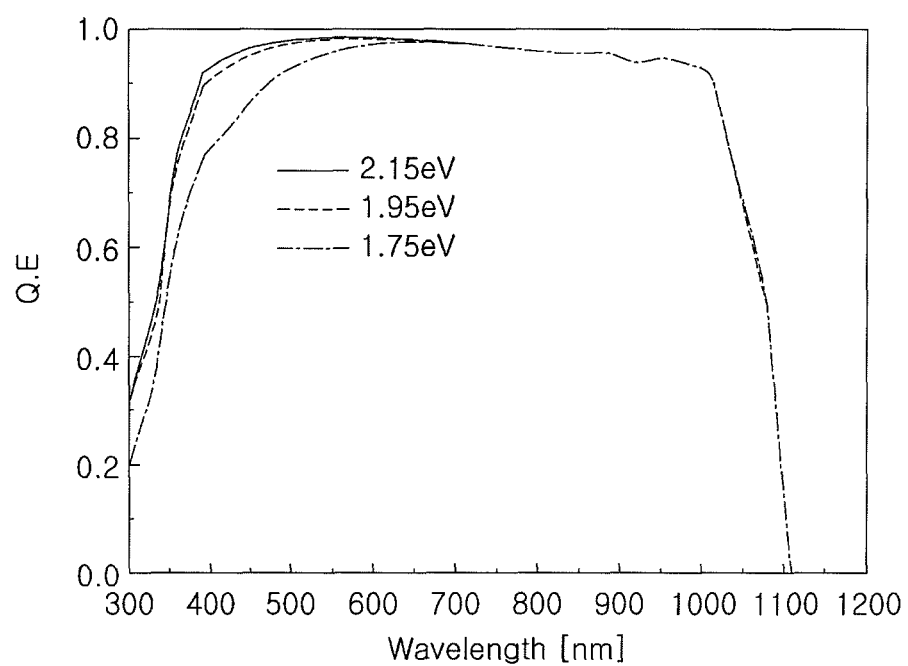
FIG. 4 illustrates quantum efficiency (QE) of a back contact solar cell of FIG. 1, which changes according to a bandgap energy of a passivation layer.

FIG. 1 is a cross-sectional view that illustrates a cross-section of a back contact solar cell in accordance with an embodiment of the invention. FIG. 2 is a diagram that illustrates change of light absorption coefficients according to band-gap energy. FIG. 3 illustrates $J_{SC}$ of a back contact solar cell of FIG. 1, which changes according to bandgap energy of a passivation layer. FIG. 4 illustrates quantum efficiency (QE) of a back contact solar cell of FIG. 1, which changes according to bandgap energy of a passivation layer.

Referring to FIG. 1, a back contact solar cell 100 includes a substrate 110, such as a crystalline silicon substrate 110 having a first conductivity type, a passivation layer 120 formed on one side of the substrate 110, an antireflection layer 130 on the passivation layer 120, a first electrode 150 on the other side of the substrate 110, and a second electrode 160 on the other side of the substrate 110 and separated from the first electrode 150.

The substrate 110 may be a crystalline silicon substrate having a first conductive type. The substrate 110 may be doped with an n-type impurity or a p-type impurity. The substrate 110 may be a single crystalline silicon substrate, a polycrystalline silicon substrate, or a microcrystalline silicon substrate. The invention, however, is not limited thereto.

One side of the substrate 110 may have an uneven surface in order to maximize an area for absorbing incident light, such as solar light. The uneven surface may also reduce a reflectivity of the solar light that is incident to the solar cell 100. Accordingly, the uneven surface may increase a catch rate (or retention rate) of incident light and reduce loss of the incident light to the solar cell 100.

The passivation layer 120 is formed on a light receiving side (also referred to as one side, a front side or a front surface) of the substrate 110. The passivation layer 120 may reduce or prevent recombination of electrons and holes which result from electron-hole pairs generated by the incident light. The passivation layer 120 may also reduce defects that may be caused when the antireflection layer 130 is directly formed on the substrate 110. Such a passivation layer 120 may include amorphous silicon oxide (a-SiOx) or amorphous silicon carbide (a-SiC). Other materials may be used for the passivation layer 120.

FIG. 2 illustrates a light absorption coefficient changing according to bandgap energy. Referring to FIG. 2, it shows that amorphous silicon oxide (a-SiOx) or amorphous silicon carbide (a-SiC) has a light absorption coefficient lower than that of amorphous silicon (a-Si) because a-SiOx or a-SiC has bandgap energy greater than that of a-Si. The a-Si is generally used to form a typical passivation layer.

Since the passivation layer 120 is made of a-SiOx or a-SiC that has a light absorption coefficient lower than that of a typical passivation layer made of a-Si, the passivation layer 120 may absorb smaller quantity of solar light incident to the substrate 110, compared to the typical passivation layer of a-Si. Therefore, the passivation layer 120 may increase the quantity of solar light incident to the substrate 110.

Meanwhile, if a passivation layer is made of amorphous silicon (a-Si) having a large amount of hydrogen (H) added to improve its band-gap energy, a plurality of pores may be generated. Such pores may deteriorate the characteristics of the passivation layer. As a result, it is difficult to improve the bandgap energy to be more than about 1.8 eV.

On the contrary, the passivation layer 120 including amorphous silicon oxide (a-SiOx) or amorphous silicon carbide (a-SiC) may have a bandgap energy that is higher than about 1.8 eV. Accordingly, the light absorption coefficient of the passivation layer 120 may be decreased compared to that of a typical passivation layer. For example, the light absorption coefficient is decreased to be lower than about 800 nm.

When bandgap energy of the passivation layer 120 is greater than about 2.25 eV, the characteristics of the passivation layer 120 may be deteriorated by added impurities. Accordingly, it is preferable, though not required, to maintain the bandgap energy of the passivation layer 120 at between about 1.8 eV and about 2.25 eV.

FIG. 3 illustrates $J_{SC}$ of the back contact solar cell 100 of FIG. 1, which changes according to bandgap energy of the passivation layer 120. FIG. 4 illustrates quantum efficiency (QE) of the back contact solar cell 100 of FIG. 1, which changes according to the bandgap energy of the passivation layer.

In FIG. 3, a curve formed along circle dots denotes the passivation layer 120 formed of amorphous silicon oxide (a-SiOx) or amorphous silicon carbide (a-SiC). A curve formed along square dots denotes a typical passivation layer formed of a-Si. As shown in FIG. 3, the passivation layer 120 formed of a SiOx or a SiC has a bandgap energy at between about 1.85 eV and about 2.25 eV. The typical passivation layer formed of a-Si has a bandgap energy lower than about 1.75 eV. FIG. 3 illustrates $J_{SC}$ of the back contact solar cell 100 including the passivation layer 120 and $J_{SC}$ of a back contact solar cell having a typical passivation layer.

As shown in FIG. 3, the passivation layer 120 formed of amorphous silicon oxide (a-SiOx) or amorphous silicon carbide (a-SiC) has $J_{SC}$ higher than that of the typical passivation layer formed of a-Si. Accordingly, an amount of light absorbed by the passivation layer 120 is reduced compared to that of the typical passivation layer. At the same time, recombination current is effectively suppressed in the passivation layer 120.

Referring to FIG. 4, as the bandgap energy of the passivation layer 120 increases, QE (quantum efficiency) also increases. Accordingly, the light-to-electric conversion efficiency of the solar cell 100 increases due to the increment of the quantity of light incident to the solar cell 100.

Referring to FIG. 1 again, the antireflection layer 130 may be disposed on the passivation layer 120 in order to reduce reflection of solar light that is incident on the front surface of the substrate 110.

When the reflection of the solar light is reduced as described above, the quantity of light reaching a p-n junction of the solar cell 100 increases and the light-to-electric conversion efficiency of the solar cell 100 may be improved.

For example, the antireflection layer 130 may be formed as a single layer selected from the group consisting of a silicon nitride layer, a silicon nitride layer having hydrogen, a silicon oxide layer, a silicon oxynitride layer, $MgF_2$, ZnS, $TiO_2$, and $CeO_2$, or formed as a multi-layered structure including at least two layers selected from the group. The antireflection layer 130 may be formed by vapor deposition, chemical vapor deposition, spin coating, screen printing, or spray coating. The invention, however, is not limited thereto.

With reference back to FIG. 1 and in accordance with an embodiment of the invention, the back contact solar cell 100 may include a first electrode 150 and a second electrode 160. The first electrode 150 and the second electrode 160 are formed on a side of the substrate 110, which faces the front side where the passivation layer 120 is formed thereon. The first electrode 150 and the second electrode 160 are separated from each other. The side of the substrate 110 which faces the front side of the substrate 110 may also be referred to as the other side, a back side or a back surface of the substrate 110.

The back contact solar cell 100 may further include a first semiconductor layer 140 disposed between the substrate 110 and the first electrode 150, and a second semiconductor layer 141 between the substrate 110 and the second electrode 160. The first semiconductor layer 140 may have a first conductivity type, and the second semiconductor layer 141 may have a second conductivity type that is opposite to the first conductivity type.

The first semiconductor layer 140 and the second semiconductor layer 141 may be an amorphous silicon (a-Si) layer or may be doped with an n-type impurity or a p-type impurity.

As described above, the first and second semiconductor layers 140 and 141 may form a hetero junction with the crystal substrate 110 because the first and second semiconductor layers 140 and 141 are made of the amorphous silicon (a-Si) layer. Accordingly, a bandgap increases at an interface of the substrate 110, and an open circuit voltage (Voc) of the solar cell 100 may be improved.

The substrate 110 may be doped with an n-type impurity or a p-type impurity, and may have a first conductivity type. For example, when the substrate 110 is an n-type silicon substrate, the first semiconductor layer 140 may include the same conductivity type impurity and a higher impurity concentration compared to those of the substrate 110. In this instance, the first semiconductor layer 140 may collect electrons obtained by way of the photoelectric effect of the solar cell 100.

Furthermore, the second semiconductor layer 141 may be doped with a second conductivity type impurity that is opposite to the first conductivity type. Accordingly, the second semiconductor layer 141 may collect holes. A p-n junction may be formed at an interface between the substrate 110 and the second semiconductor layer 141.

On the contrary, when the substrate 110 is a p-type silicon substrate, the first semiconductor layer 140 may collect holes since the first semiconductor layer 140 includes the same conductivity type impurity and a higher impurity concentration compared to those of the substrate 110.

Figure 7:
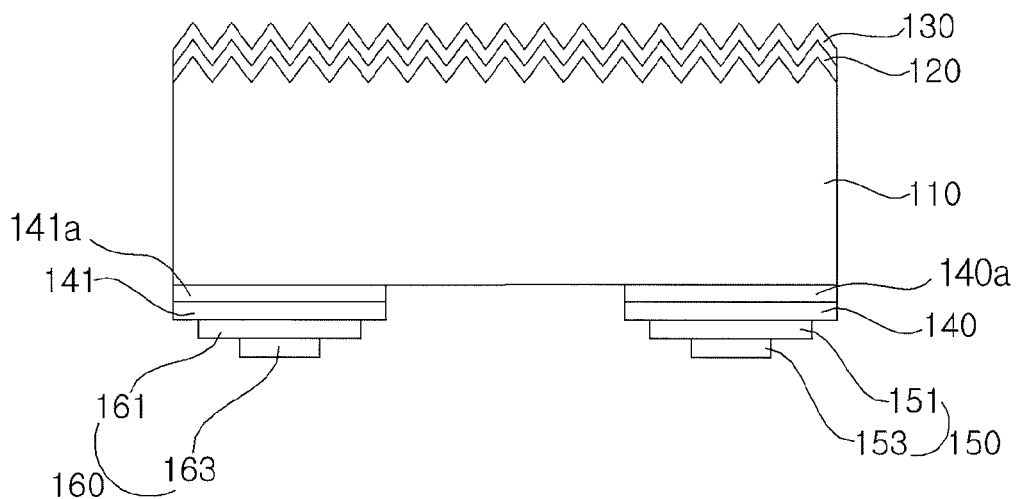
FIG. 7 is a cross-sectional view that illustrates a cross-section of a back contact solar cell in accordance with another embodiment of the invention.

The solar cell 100 may optionally include an intrinsic amorphous silicon layer 140a, 141a between the substrate 110 and at least one of the first and second semiconductor layers 140 and 141 (see FIG. 7). The intrinsic amorphous silicon layer may be formed on an entire bottom side (or the back side) of the substrate 110. Alternatively, the intrinsic amorphous silicon layer 140a, 141a may be formed at only areas where the first and second semiconductor layers 140 and 141 are formed (see FIG. 7), or at areas that include the first and second semiconductor layers 140 and 141 either fully or partially.

The first electrode 150 may electrically contact the first semiconductor layer 140, and the second electrode 160 may electrically contact the second semiconductor layer 141. Accordingly, the first and second electrodes 150 and 160 may transfer electrons and holes collected at the first and second semiconductor layers 140 and 141 to the outside.

The first and second electrodes 150 and 160 may include transparent electrode layers 151 and 161 and metal layers 153 and 163, respectively. For convenience and ease of understanding, the first electrode 150 will be representatively described, hereinafter. However, description of the first electrode 150 may be equally applied to the second electrode 160.

The transparent electrode layer 151 may be made of a transparent conductive oxide (TCO). The transparent electrode layer 151 may improve adhesiveness between the first semiconductor layer 140 made of amorphous silicon and the metal layer 153 made of metal. The transparent electrode layer 151 may include at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO, but the embodiments of the invention are not limited thereto.

The metal layer 153 on the transparent electrode layer 151 may reduce resistance for the first electrode 150 and may be electrically connected to an external terminal or an external circuit. The metal layer 153 may be made of metal having low electric resistance, such as gold, silver, copper, or aluminum. However, embodiments of the invention are not limited thereto.

An insulation layer may optionally be formed between the first electrode 150 and the second electrode 160. The insulation layer may prevent the first electrode 150 and the second electrode 160 from being shorted.

Figure 8:
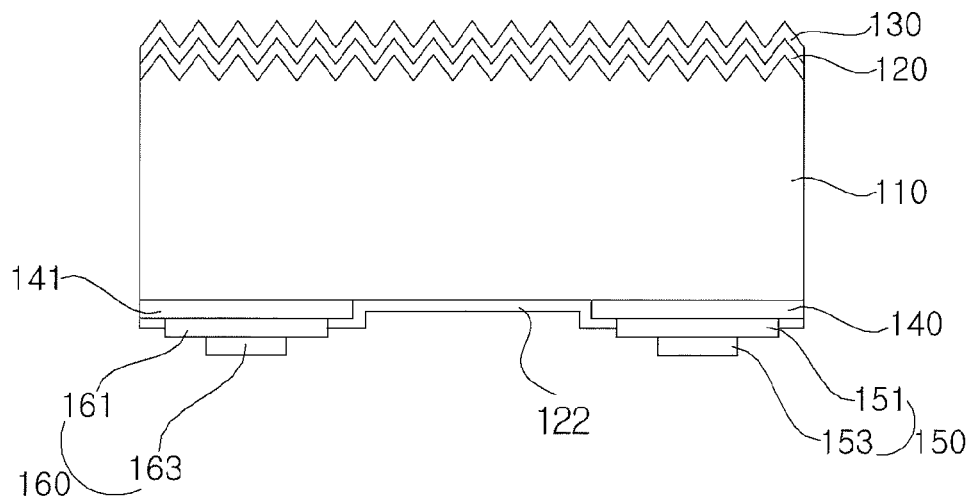
FIG. 8 is a cross-sectional view that illustrates a cross-section of a back contact solar cell in accordance with yet another embodiment of the invention.

In accordance with an embodiment of the invention, the back contact solar cell 100 may further include a rear passivation layer 122 (see FIG. 8) on the other side (or the back side) of the substrate 110. For example, the rear passivation layer may be formed on a top side (or an exposed surface) of the first and second semiconductor layers 140 and 141 when the first and second semiconductor layers 140 and 141 are continuously formed. Furthermore, the rear passivation layer may be formed on the other side of the substrate 110 and be located between the first and second semiconductor layers 140 and 141, as well as on the top side of the first and second semiconductor layers 140 and 141 when the first and second semiconductor layers 140 and 141 are formed at an interval (i.e., are separated).

The rear passivation layer may be made of the same material as that of the passivation layer 120. That is, the rear passivation layer may be made of amorphous silicon oxide (a-SiOx) or amorphous silicon carbide (a-SiC). The rear passivation layer may have a dual layer structure including an a-Si layer as a first layer and one of an amorphous silicon oxide (a-SiOx) layer and an amorphous silicon carbide (a-SiC) layer as a second layer. The rear passivation layer may also have a multilayer structure formed of three or more layers.

When the solar cell 100 includes the rear passivation layer, the first and second electrodes 150 and 160 may penetrate through the rear passivation layer and contact the first and second semiconductor layers 140 and 141.

Figure 5:
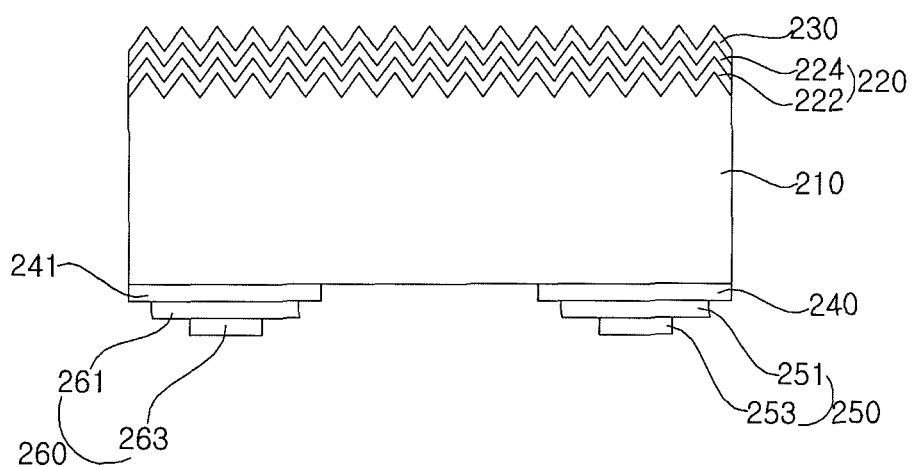
FIG. 5 is a cross-sectional view that illustrates a cross-section of a back contact solar cell in accordance with another embodiment of the invention.

FIG. 5 is a cross-sectional view that illustrates a cross-section of a back contact solar cell in accordance with another embodiment of the invention.

Referring to FIG. 5, the back contact solar cell 200 includes a substrate 210, a passivation layer 220 on one side of the substrate 210, an antireflection layer 230 on the passivation layer 220, and first and second electrodes 250 and 260 formed on the other side of the substrate 210. The back contact solar cell 200 further includes first and second semiconductor layers 240 and 241 between the substrate 210 and the first and second electrodes 250 and 260, respectively.

Since the substrate 210, the antireflection layer 230, the first and second electrodes 250 and 260, and the first and second semiconductor layers 240 and 241 are identical to those shown in FIG. 1, the detailed descriptions thereof will be omitted herein.

Referring to FIG. 5, the passivation layer 220 may include a first layer 222 and a second layer 224 formed on the first layer 222. The first layer 222 may be made of amorphous silicon (a-Si), and the second layer 224 may be made of amorphous silicon oxide (a-SiOx) or amorphous silicon carbide (a-SiC).

In a manner shown in FIG. 1, the second layer 224 also includes amorphous silicon oxide (a-SiOx) or amorphous silicon carbide (a-SiC). Accordingly, the bandgap energy of the passivation layer 220 is improved, and quantity of light absorbed into the passivation layer 220 may be reduced.

The density of electrons and holes generated at the solar cell 200 may be concentrated at a front surface of the substrate 210 and may be geometrically reduced along the depth of the substrate 210. In order to reduce or prevent this phenomenon, the first layer 222 made of a-Si may be formed on the substrate 210 in accordance with an embodiment of the invention. Accordingly, recombination of electron and hole may be further effectively reduced or prevented.

Figure 6:
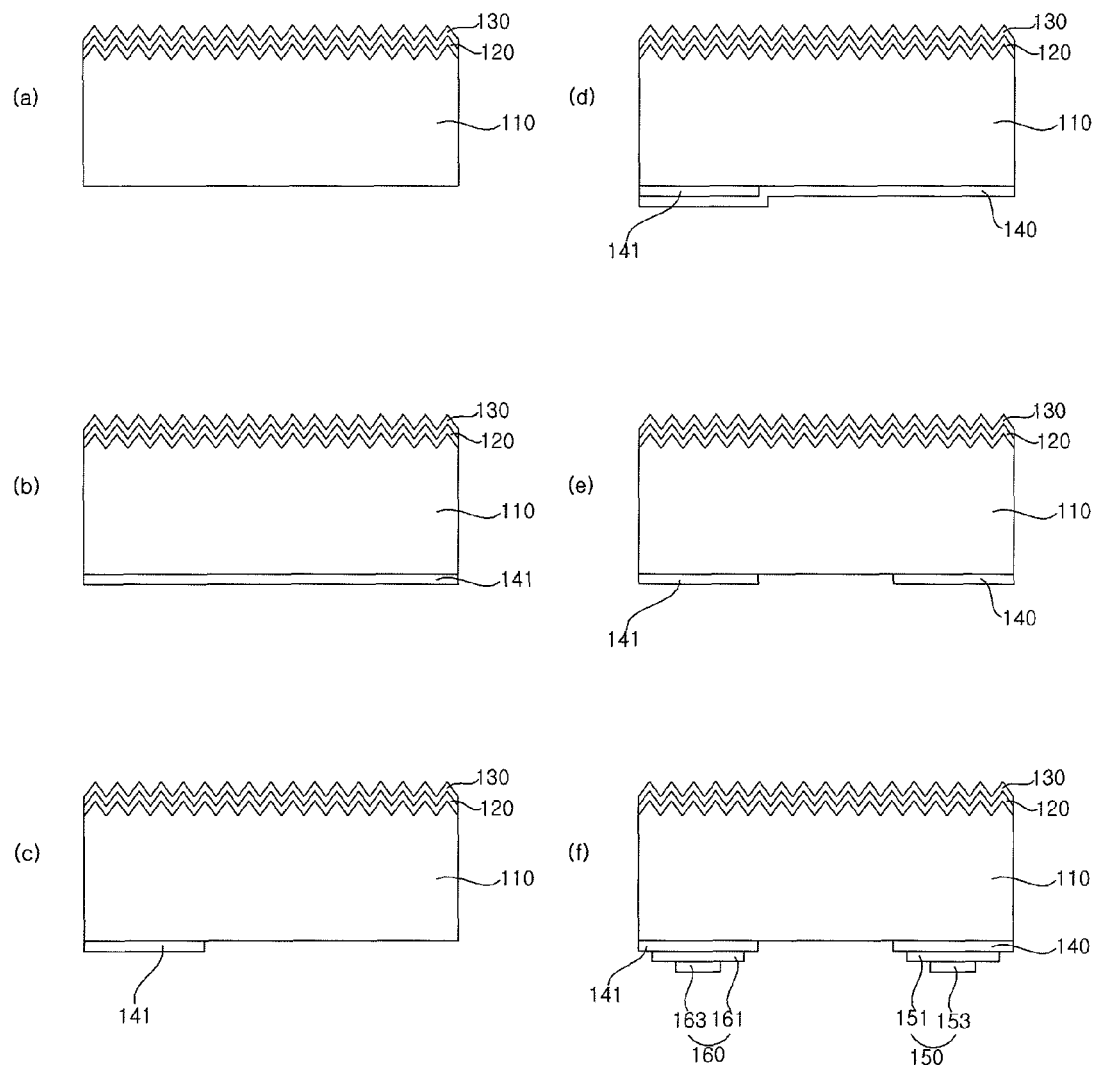
FIG. 6 illustrates a method for manufacturing a back contact solar cell of FIG. 1

FIG. 6 illustrates a method for manufacturing a back contact solar cell of FIG. 1

Referring to FIG. 6, one side of the substrate 110 may be textured as shown in a diagram (a) of FIG. 6. As a result, an uneven surface is formed at the one side of the substrate 110. After the texturing process, a passivation layer 120 and an antireflection layer 130 are sequentially formed on the uneven surface of the substrate 110.

The texturing process may form an uneven pattern at a surface of the substrate 110. If the uneven pattern is formed on the surface of the substrate 110 through the texturing process, reflectivity of incident light becomes reduced and a catch rate (or retention rate) of incident light becomes increased. Therefore, loss of incident light may be reduced.

When the uneven pattern is formed through the texturing process, the passivation layer 120 and the antireflection layer 130 may be sequentially formed on the substrate 110 along the uneven pattern of the substrate 110. As a result, the passivation layer 120 and the antireflection layer 130 may also have an uneven pattern.

As the texturing process, the substrate 110 may be immersed in an etching solution. The uneven pattern may be formed in various shapes such as a pyramid, rectangle, and triangle.

The passivation layer 120 may be formed through one of sputtering, e-beam evaporation, chemical vapor deposition (CVD), physical vapor deposition (PDV), metal-organic chemical vapor deposition (MOCVD), molecular beam epitaxial (MBE), and Atomic Layer Deposition.

Meanwhile, the passivation layer 120 may include amorphous silicon oxide (a-SiOx) or amorphous silicon carbide (a-SiC). Accordingly, the passivation layer 120 may have a bandgap energy higher than about 1.8 eV, preferably between about 1.8 and about 2.25 eV. Therefore, the passivation layer 120 reduces or prevents incident light from being absorbed into the passivation layer 120. Finally, the quantity of light that is incident to the substrate 110 may be increased.

As described in FIG. 5, the passivation layer 120 may include a first layer and a second layer. The first layer may be made of amorphous silicon (a-Si), and the second layer may be made of one of amorphous silicon oxide (a-SiOx) and amorphous silicon carbide (a-SiC). When the passivation layer 120 further includes the first layer made of a-Si, electron and hole recombination can be effectively reduced or prevented.

The antireflection layer 130 may be formed through one of sputtering, e-beam evaporation, chemical vapor deposition (CVD), physical vapor deposition (PDV), and Atomic Layer Deposition. However, embodiments of the invention are not limited thereto.

As shown in diagrams (b) and (c), an amorphous silicon (a-Si) layer including p-type or n-type impurity may be formed on the other side (the back side) of the substrate 110, and a second semiconductor layer 141 is formed by patterning the a-Si layer.

In the patterning process, a photo-resist layer having an opening is disposed corresponding to the second semiconductor layer 141, and an exposing process, a developing process, and an etching process are sequentially carried out.

As shown in diagrams (d) and (e), an amorphous silicon (a-Si) layer having a n-type or a p-type impurity is formed entirely on the other side of the substrate 110 to have the opposite conductivity type of the second semiconductor layer 141. Then, a first semiconductor layer 140 is formed by patterning the a-Si layer.

The patterning process for forming the first semiconductor layer 140 may be identical to that for forming the second semiconductor layer 141. FIG. 6 illustrates that the first semiconductor layer 140 is formed after the second semiconductor layer 141 is formed. However, embodiments of the invention are not limited thereto. The first semiconductor layer 140 may be formed first before the second semiconductor layer 141 is formed.

An intrinsic amorphous semiconductor layer contacting the substrate 110 may be formed before forming the first and second semiconductor layers 140 and 141. The intrinsic amorphous semiconductor layer may be formed entirely on a bottom side of the substrate 110. Alternatively, the intrinsic amorphous semiconductor layer may be formed on only areas corresponding to the first and second semiconductor layers 140 and 141.

As shown in diagram (f) of FIG. 6, the first and second electrodes 150 and 160 may be formed on the first and second semiconductor layers 140 and 141, respectively.

The first and second electrodes 150 and 160 may include transparent electrode layers 151 and 161 and metal electrode layers 153 and 163, respectively.

The transparent electrode layers 151 and 161, and the metal electrode layers 153 and 163 may be formed by disposing a mask having openings corresponding to areas for forming the transparent electrode layers 151 and 161 and metal electrode layers 153 and 163, and then carrying out one of sputtering, e-beam evaporation, chemical vapor deposition (CVD), physical vapor deposition (PDV), metal-organic chemical vapor deposition (MOCVD), molecular beam epitaxial (MBE), and Atomic Layer Deposition.

A rear passivation layer may be formed on the other side of the substrate 110 before forming the first and second electrodes 150 and 160. The rear passivation layer may be made of the same material as that of the passivation layer 120.

The rear passivation layer may be formed by: i) depositing a rear passivation layer on the other side of the substrate 110; ii) forming a mask layer having openings located on the top areas (or exposed areas) of the first and second semiconductor layers 140 and 141; and iii) forming openings at the rear passivation layer using the mask layer and removing the mask.

The first and second electrodes 150 and 160 may contact the first and second semiconductor layers 140 and 141 through the openings of the rear passivation layer.

Embodiments of the invention are not limited to configurations of the above described embodiments. That is, a back contact solar cell in accordance with an embodiment of the invention may be modified in various ways. For example, a back contact solar cell may include the entire configuration of one of the above described embodiments or selectively include predetermined parts of corresponding embodiments.

The foregoing embodiments and aspects of the invention are merely for example and are not to be construed as limiting the invention. The teaching can be readily applied to other types of apparatuses. Also, the description of the exemplary embodiments of the invention is intended to be illustrative, and not to limit the scope of the claims, and many alternatives, modifications, and variations will be apparent to those skilled in the art.

What is claimed is:

1. A back contact solar cell comprising:
a substrate made of crystalline silicon having a first conductivity type;
a passivation layer on a front side of the substrate;
an antireflection layer on the passivation layer;
a first electrode on a rear side of the substrate;
a second electrode on the rear side of the substrate and separated from the first electrode;
a first semiconductor layer disposed between the first electrode and the substrate and having the first conductivity type; and
a second semiconductor layer disposed between the second electrode and the substrate and having a second conductivity type that is opposite to the first conductivity type,
wherein the passivation layer is formed on the front side of the substrate opposite to the rear side of the substrate where the first semiconductor layer and the second semiconductor layer are formed,
wherein the passivation layer comprises:
a first layer on the front side of the substrate, wherein the first layer includes amorphous silicon; and
a second layer on the first layer, wherein the second layer includes at least one of amorphous silicon oxide, and
wherein the first layer is disposed between the substrate and the second layer,
wherein a light absorption coefficient of the second layer is lower than a light absorption coefficient of the first layer,
wherein the second layer of the passivation layer has a bandgap energy of between about 1.8 eV and about 2.25 eV, and
wherein the first layer of the passivation layer is a separate layer from the substrate, and the first layer of the passivation layer has a different crystalline structure from that of the substrate.

2. The back contact solar cell of claim 1, wherein the first semiconductor layer is an amorphous silicon layer having an impurity concentration that is higher than that of the substrate.

3. The back contact solar cell of claim 1, further comprising an intrinsic amorphous semiconductor layer disposed between the substrate and the first semiconductor layer.

4. The back contact solar cell of claim 1, wherein the second semiconductor layer is an amorphous silicon layer for forming a hetero junction at an interface between the second semiconductor layer and the substrate.

5. The back contact solar cell of claim 1, further comprising an intrinsic amorphous semiconductor layer disposed between the substrate and the second semiconductor layer.

6. The back contact solar cell of claim 1, wherein the antireflection layer is a transparent electrode.

7. The back contact solar cell of claim 1, wherein each one of the first and second electrodes includes a transparent electrode layer, and a metal layer on the transparent electrode layer.

8. The back contact solar cell of claim 1, wherein an uneven surface is formed on the front side of the substrate.

9. The back contact solar cell of claim 1, further comprising a rear passivation layer on the rear side of the substrate,
wherein the first electrode contacts the first semiconductor layer through the rear passivation layer, and the second electrode contacts the second semiconductor layer through the rear passivation layer.

10. The back contact solar cell of claim 9, wherein the rear passivation layer is made of a material identical to that of the passivation layer.

* * * * *